United States Patent [19]

Bothorel

[11] Patent Number: 5,640,692
[45] Date of Patent: Jun. 17, 1997

[54] TRANSMISSION SYSTEM FOR THE TRANSMIT PART OF A TERMINAL ASSOCIATED WITH A DIGITAL MOBILE RADIO INSTALLATION

[75] Inventor: Eric Bothorel, Paris, France

[73] Assignee: Alcatel Mobile Communication France, Paris, France

[21] Appl. No.: 263,442

[22] Filed: Jun. 21, 1994

[30] Foreign Application Priority Data

Jun. 22, 1993 [FR] France ................................. 93 07541

[51] Int. Cl.⁶ ............................................ H04B 1/04
[52] U.S. Cl. ............................ 455/127; 455/126; 455/115
[58] Field of Search ........................... 455/91, 117, 115, 455/126, 127, 116; 375/261, 295, 296, 297, 298; 332/103, 104, 105

[56] References Cited

U.S. PATENT DOCUMENTS

| | | | |
|---|---|---|---|
| 5,144,258 | 9/1992 | Nakanishi et al. | 455/126 |
| 5,247,542 | 9/1993 | Onodera et al. | 332/103 |
| 5,260,973 | 11/1993 | Watanabe | 375/295 |
| 5,291,148 | 3/1994 | Reisner et al. | 330/149 |
| 5,307,512 | 4/1994 | Mitzlaff | 455/126 |
| 5,434,887 | 7/1995 | Osaka | 332/103 |

FOREIGN PATENT DOCUMENTS

| | | |
|---|---|---|
| 0388894A1 | 9/1990 | European Pat. Off. . |
| 3820985A1 | 2/1990 | Germany . |

OTHER PUBLICATIONS

Faulkner et al, "Error Sensitivity of Power Amplifiers Using Pre–Distortion", *41st IEEE Vehicular Technology Conference*, May 1991, pp. 451–456.
French Search Report FR 9307541.

*Primary Examiner*—Reinhard J. Eisenzopf
*Assistant Examiner*—Marsha D. Banks-Harold
*Attorney, Agent, or Firm*—Sughrue, Mion, Zinn, Macpeak & Seas

[57] ABSTRACT

A transmission system for digital mobile radio installation mobile terminals includes an attenuator on the input side of the mixer in order to apply to the latter signals at an rms level of only approximately 70 millivolts. The preamplifier is therefore a very high gain amplifier (typically 30 dB) and is followed by a level limiter circuit.

4 Claims, 1 Drawing Sheet

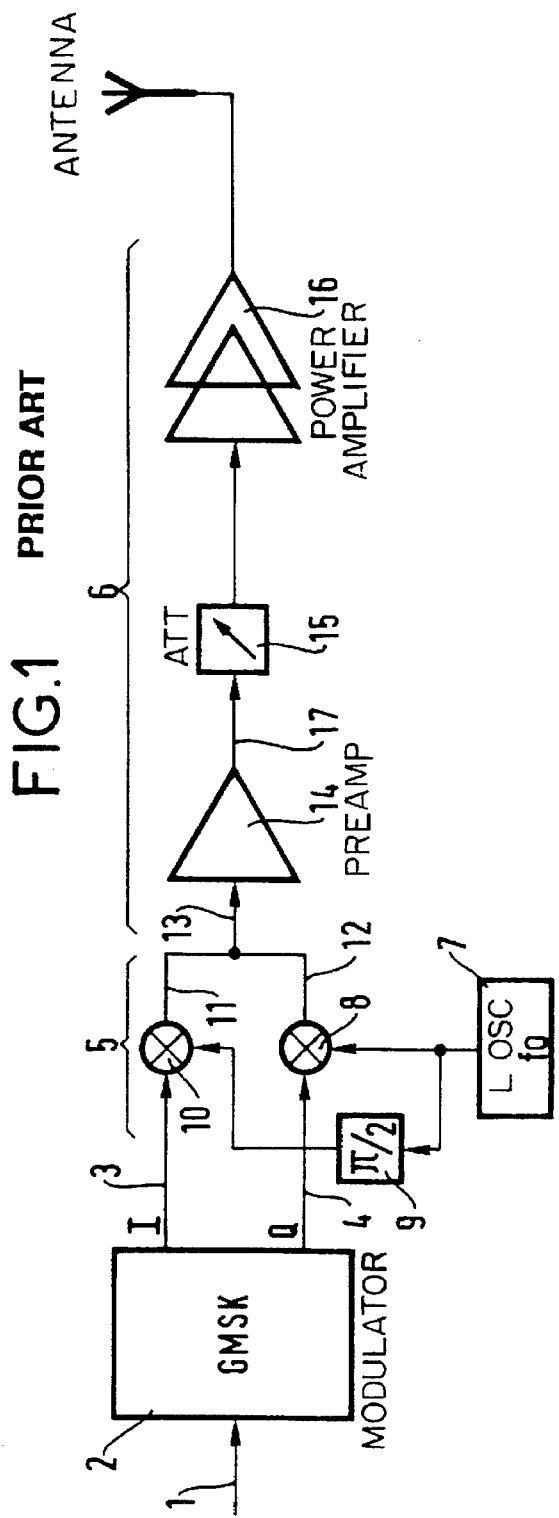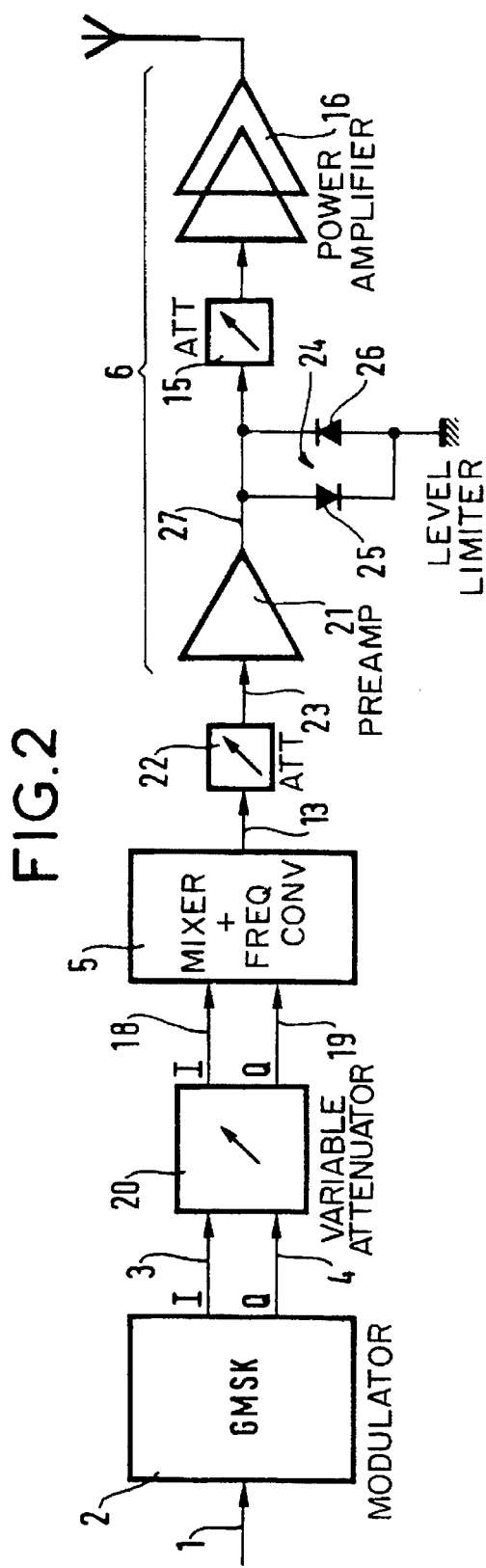

TRANSMISSION SYSTEM FOR THE TRANSMIT PART OF A TERMINAL ASSOCIATED WITH A DIGITAL MOBILE RADIO INSTALLATION

BACKGROUND OF THE INVENTION

1. Field of the invention

The present invention concerns a transmission system for the transmit part of a terminal associated with a digital mobile radio installation.

2. Description of the Prior Art

In a conventional digital mobile radio installation, radio coverage is currently organized in the following manner:

The coverage area is divided into a mosaic of hexagonal cells whose radius is between 1 km and 35 km, depending on the nature of the environment. It is in the order of 35 km in open country whereas it is in the order of 1 km to 3 km in urban areas.

A base transceiver station (BTS) is located at the center of each hexagonal cell in the coverage area and provides the radio link to all the mobile terminals within the perimeter of this cell. It therefore comprises all the radio frequency equipment needed to provide the coverage for a cell.

Each mobile terminal is a transceiver and has a microprocessor-based digital control and digital signal processing part and a radio frequency transceiver part.

The invention is concerned with the radio frequency amplifier system of the transmit part of a mobile terminal of this type.

The appended FIG. 1 outlines the constitution of a transmission system for a mobile terminal transmitter which is part of a prior art digital mobile radio installation.

The digital signal, made up of streams of bits, present at the input 1 of the transmit system is first phase modulated by a conventional "GMSK" modulator 2.

The modulator 2 supplies phase-modulated analog signals to two conventional output paths 3 and 4 in phase quadrature called by convention the "I" path and the "Q" path.

These are baseband signals. To be transmitted at radio frequency by the transmit antenna 4 the signals modulate a carrier, in a mixer unit 5, and are amplified in an amplifier system 6.

The mixer unit 5 conventionally comprises a local oscillator 7 whose output signals at a fixed frequency fo are fed to a first input of a simple mixer 8 which receives the Q path signals on its other input and, via a 90° phase-shifter 9, to a first input of another simple mixer 10 which receives the I path signals on its other input.

The signals obtained at the outputs 11 and 12 of the simple mixers 10 and 8 are then combined on a common line 13. After conventional filtering (not shown) they are then passed to the amplifier system 6.

The rms amplitude of the signals at the mixer input on the two paths I and Q in phase quadrature is typically in the order of 100 mV.

The amplifier system 6 comprises in sequence a preamplifier 14, a variable attenuator 15 and a power amplifier 16.

The preamplifier 14, whose gain is typically in the order of 17 dB, for example, matches the output level of the mixer 5 to the input level of the power amplifier 16.

The variable attenuator 15 enables fine adjustment of the system 6 according to the tolerances of its components.

For a mobile terminal of this type, where the cost must be kept fairly low, the power amplifier 16 is a commercially available hybrid amplifier, of which there is a relatively restricted choice. For an input level of 0 dBm it typically supplies an output level between 13 dBm and 39 dBm.

The signal level at the input 13 of the preamplifier 14 is typically in the order of −15 dBm and that at the input 17 of the attenuator in the order of +2 dBm.

This prior art device gives rise to two manufacturing problems if the specifications for this kind of mobile radio installation are to be complied with, a first problem relating to conforming to the spectrum and being associated with signal modulation and a second problem concerning residual spurious amplitude modulation affecting the signal at the transmit antenna.

The specifications require all mobile telephone manufacturers to conform as closely as possible to a clearly defined theoretical spectrum. This theoretical spectrum includes clearly specified nominal rejections directly related to the modulation process itself.

The signals are conventionally transmitted in packets or "bursts" of digital information and the specifications state that for each burst the power must be transmitted in accordance with a clearly defined template. For example, it must be transmitted at between +1 dB and −1 dB relative to the mean value of the transmitted power, which in the final analysis characterizes the maximal amplitude modulation of the signal tolerated by the system.

Prior art devices have problems in conforming to these specifications.

A first problem concerns the inherent characteristics of the mixer employed, such as the mixer 5 in FIG. 1.

The conventional way to test the performance of a mixer of this kind is to use an auxiliary signal generator to inject into it a sinusoidal signal whose frequency fm represents one quarter of the required binary bit rate. The conventional binary bit rate is 270 kHz, so that the frequency fm is 67.7 kHz.

The signal at frequency fm is simultaneously injected with a relative phase-shift of 90° into the I path 3 and into the Q path 4.

Ideally, there should be at the output 13 of the mixer 5 simply a pure component at the required frequency fo−fm.

Unfortunately, spurious frequencies are observed in practice, including the frequency fo of the local oscillator 7, constituting a local oscillator frequency residue, a spurious residue of the image frequency at fo+fm, distortion components and a third order intermodulation component 3.

It is these spurious frequency components which are responsible for the residual amplitude modulation of the modulated signal. Another problem is the non-linearity of the power amplifier 16 at the end of the transmit system: it is typically necessary to use power modules which operate in class AB, and the linearity of these power modules is far from optimal.

Because of the intrinsic characteristics of the modulation, on the output side of the mixer 5 the spectrum is inevitably asymmetrical. Downstream of the mixer it is therefore necessary to allow for amplifier stages which have an asymmetry which is the converse of that of this spectrum. The problem here is further degradation of performance in terms of amplitude modulation and spectrum (associated with modulation).

SUMMARY OF THE INVENTION

The invention is directed to remedying these problems. To this end it concerns a transmission system for the transmit part of a mobile terminal associated with a digital mobile radio installation, said transmission system including a baseband modulator supplying I and Q paths in phase quadrature from the digital input signal, a mixer/frequency converter of moderate performance and an amplifier including a preamplifier driving a commercially available power amplifier of moderate performance, wherein:

means are provided for attenuating the amplitude of signals on the I and Q paths in phase quadrature in order to apply to said mixer input signals at a lower level than would otherwise be obtained from said modulator;

said preamplifier is chosen to have a much higher gain than the preamplifier which would conventionally be included in a like transmission system, but without said attenuation means, and is also chosen to have a high compression point; and a level limiter and fixing circuit is provided on the output side of the preamplifier and on the input side of the power amplifier.

BRIEF DESCRIPTION OF THE DRAWINGS

FIG. 1 shows a transmission system for a mobile terminal transmitter which is part of a prior art digital mobile radio installation.

FIG. 2 is a block diagram of a transmission system according to the invention.

DETAILED DESCRIPTION OF THE PREFERRED EMBODIMENT

The invention will be clearly understood and its advantages and other features will emerge more clearly from the following description of one embodiment of the invention given with reference to the appended FIG. 2 which is a block diagram of the transmission system.

Components in FIG. 2 identical to components in FIG. 1 are identified by the same reference number, to make the description clearer.

This applies in particular to the GMSK modulator 2, the mixer and frequency converter 5, the variable attenuator 15 and the power amplifier 16.

Note that in this new implementation as in the conventional implementation shown in FIG. 1 the power amplifier is an "off the shelf" amplifier, implemented in hybrid technology, and offering moderate performance, and likewise the mixer-frequency converter 5.

The GMSK modulator 2 is also of a standard type and, as already explained, provides a voltage at its two outputs 3 and 4 which correspond to the two paths I and Q in phase quadrature. This voltage has an rms amplitude in the order of 100 mV, for example.

A first feature of the invention consists in supplying to the mixer-converter 5 input signals of the I path on a first input 18 and of the Q path on a second input 19, respectively, with amplitudes significantly lower than the signals on the lines 3 and 4 at the output of the modulator 2.

The input signals on the lines 18 and 19 have an rms amplitude of 70 mV, for example, rather than 100 mV. In this example this is achieved by inserting between the modulator 2 and the mixer 5 a variable attenuator 20 acting simultaneously on the two paths I and Q in phase quadrature.

Because the mixer-converter 5 operates on input signals of lower amplitude it is immediately possible to increase the rejection of the previously mentioned unwanted third order intermodulation products.

The power level then available at the output 13 of the mixer is −18 dBm, for example, rather than −15 dBm as in the prior art.

Consequently, the amplifier system 6 is provided with a preamplifier 21 of much higher gain than the preamplifier 14 in the conventional implementation shown in FIG. 1. The preamplifier 21 has a gain of 30 dB, for example, whereas that of the preamplifier 14 was only 17 dB.

Also, in order not to lose what has been gained hereby in terms of rejection of intermodulation products by working too close to the compression point of the preamplifier 21, the latter is chosen to have a high compression point, for example a compression point at +11 dBm rather than at +7 dBm for the prior art preamplifier 14.

A variable attenuator is provided between the mixer 5 and the preamplifier 21 so that the signal level can be matched to the gain characteristic of the preamplifier. The signal level at the input 23 of the preamplifier 21 is −24 dBm, for example.

The second feature of the invention consists in providing, at the output of the high-gain preamplifier 21, a level limiter circuit 24 including two peak limiter diodes 25 and 26. The output level is then conventionally limited to the value, whether positive or negative, defined by the conduction threshold of the two diodes 25 and 26 which are connected between the output 27 of the preamplifier 21 and ground, with reverse polarities as shown.

The level at the input of the attenuator 15 is then +2 dBm, for example, as compared with +6 dBm without the circuit 24.

The level limiter circuit 24 has two functions:

firstly, it further improves rejection of residual amplitude modulation;

secondly, it tightens up the dynamic range of the input level of the power amplifier 16, in order to fix and guarantee its output power level.

Obviously, the invention is not limited to the embodiments described. To the contrary, it can be implemented in numerous variants and can use many equivalent means.

There is claimed:

1. Transmission system for the transmit part of a mobile terminal associated with a digital mobile radio installation, said transmission system including a baseband modulator supplying I and Q paths in phase quadrature from a digital input signal, a mixer/frequency converter of moderate performance and an amplifier including a commercially available power amplifier of moderate performance and a preamplifier driving said commercially available power amplifier, wherein:

means are provided for attenuating the amplitude of signals on the I and Q paths in phase quadrature in order to apply, to said mixer, attenuated input signals;

a level limiter is provided between the output side of the preamplifier and the input side of the power amplifier; and said preamplifier is chosen to have a gain sufficiently high to compensate the attenuation resulting from said attenuating means, thereby establishing the level of a signal which is applied to said commercially available power amplifier as a function of threshold of said level limiter.

2. Transmission system according to claim 1 wherein said level limiting circuit is a peak limiter diode circuit.

3. Transmission system according to claim 1 wherein said attenuator means comprise a variable attenuator.

4. Transmission system according to claim 1 wherein said preamplifier has a gain in the order of 30 dB.

\* \* \* \* \*